(12) United States Patent
Watanabe et al.

(10) Patent No.: US 6,590,231 B2
(45) Date of Patent: Jul. 8, 2003

(54) TRANSISTOR THAT USES CARBON NANOTUBE RING

(75) Inventors: Hiroyuki Watanabe, Minamiashigara (JP); Masaaki Shimizu, Nakai-machi (JP); Chikara Manabe, Minamiashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/923,448

(22) Filed: Aug. 8, 2001

(65) Prior Publication Data
US 2002/0024099 A1 Feb. 28, 2002

(30) Foreign Application Priority Data

Aug. 31, 2000 (JP) ........................................ 2000-263943

(51) Int. Cl.[7] ...................... H01L 31/0312; H01L 29/76
(52) U.S. Cl. .......................... 257/77; 257/401; 257/288; 257/368
(58) Field of Search .......................... 257/77, 288, 368, 257/401; 438/105, 931, 284, 286

(56) References Cited

U.S. PATENT DOCUMENTS 3,803,461 A * 4/1974 Beneking ..................... 257/280
6,297,063 B1 * 10/2001 Brown et al. .................. 438/2

OTHER PUBLICATIONS

Watanabe et al., "Dual–probe scanning tunneling microscope:Measuring a carbon nanotube ring transistor", Applied Physics Letters, vol. 78,No. 19, May 7, 2001.*
Martel et al., "Ring Formation In Single–Wall Carbon Nanotubes", The Journal of Physical Chemistry B, vol. 103, No. 36, Sep. 9, 1999, pp. 7551–7556.

* cited by examiner

Primary Examiner—Nathan J. Flynn
Assistant Examiner—Tan Tran
(74) Attorney, Agent, or Firm—Oliff & Berridge,PLC

(57) ABSTRACT

A transistor of nanometer size is provided, which is capable of high-speed operation and operates at room temperatures by using carbon nanotubes for semiconductor devices. The transistor uses a carbon nanotube ring having semiconductor characteristics as a semiconductor material, or a carbon nanotube ring having conductivity or semiconductor characteristics as an electrode material.

19 Claims, 3 Drawing Sheets

TRANSISTOR THAT USES CARBON NANOTUBE RING

BACKGROUND OF THE INVENTION

1. Field of the Invention

The present invention relates to a transistor that is applicable to electronic devices, and more particularly to a transistor of nanometer size that operates at room temperatures.

2. Description of the Prior Art

Fullerene and carbon nanotube discovered in recent years are in the limelight as a new carbon substance different from graphite, amorphous carbon, and diamond that had been known until then. This is because the fullerene and carbon nanotube exhibit specific electronic physical properties different from those of existing carbon substances.

For example, fullerene typified by $C_{60}$ and $C_{70}$ contains many carbon atoms placed in spherical cage form to constitute one molecule, and dissolves in organic solvents such as benzene. There are many kinds of fullerene including $C_{60}$ and $C_{70}$ that exhibit the nature of superconductors and semiconductors. Also, the fullerene has a high light-sensing effect and is expected to be used as an electrophotographic photosensitive material. Furthermore, fullerene can exhibit effective physical properties as a functional material when a different kind of element is confined inside it, or many kinds of chemical functional groups are added to the outside thereof.

Carbon nanotube is a new material containing only carbon, like fullerene. Functions such as an electron emission source, a semiconductor material, a hydrogen storage material have been discovered. Particularly, since it can function as a semiconductor or conductor according to a slight change in the chirality of atom array, it is expected to be used as a switching device of nanometer size in various fields of the electronics industry.

On the other hand, for silicon devices that are dominant electronic devices, with the development of advanced microfabrication techniques, the gate electrode width of a field effect transistor (FET) is miniaturized to about 0.1 $\mu$m, and owing to an increased level of integration, a memory having an operation speed of about 1 Gbit is prototyped. The most advantageous point of a silicon device is that, in the case where a silicon oxide is used as an insulator, the interface level between the silicon and the silicon oxide is remarkably low, and an oxidation MOS (metal oxide semiconductor) transistor can be easily formed. By using the small-sized MOS transistor having low power consumption in logical circuits, a high level of integration of devices has become possible. A highly pure silicon material is produced by the halogen process, while a semiconductor wafer 30 cm or more in diameter is fabricated by the Czochralski crystal growth method, so that the productivity of devices is extremely high.

However, silicon is low in carrier mobility and has a limited switching speed. The drawbacks have been solved by the GaAs field-effect transistor (GaAs-FET) and GeSi bipolar transistor. The carrier mobility of GaAs is higher than that of silicon and the GaAs-FET has much higher operation speed than Si transistors. Also, a GeSi bipolar transistor, although comparable to the GaAs-FTE in operation speed, is being frequently used in portable terminals and the like because of its cheap device unit cost.

Furthermore, to achieve a switching speed of several tens of GHz, HEMT (high electron mobility transistor) produced by two-dimensional electronic gases in which electrons and holes are two-dimensionally confined was devised. At present, these devices are electronic devices indispensable to high-frequency communications of several GHz or more, including mobile communications.

At present, electronic devices expected for higher operation speeds are ones having a low-dimension structure such as quantum thin lines and quantum dots. By confining electrons and holes one-dimensionally (line) or 0-dimensionally (dot), it is conceivable that ultrafast operation is achieved. The low-dimension structure of semiconductor devices not only breaks the limit of device size but also is expected as an important technology for achieving ultrafast operation of switching devices.

Particularly, since carbon nanotubes have a diameter as small as several nm, their electrical conduction mechanism is equal to one dimension and they are is in the limelight as low-dimension conductive substance. Since some single-wall carbon nanotubes exhibit semiconductor characteristics, they have a latent capability to form transistors of nanometer size from the carbon nanotubes. At present, the commutation characteristic of the carbon nanotubes at ordinary temperatures is confirmed, and one-dimensional quantum condition (Luttinger liquid condition) at room temperatures is also experimentally suggested. Therefore, by applying a ballistic conduction mechanism at ordinary temperatures, it is conceivable that switching devices of the carbon nanotubes having an operation speed of several THz can be realized.

Also, the processing process of silicon devices have many problems for further microminiaturization and nears technological limitations. Particularly, in exposure technologies, for technologies of a line width of 0.1 $\mu$m or less, which is an optical limit, although the $F_2$ laser exposure method, the electronic beam exposure method, and the like are proposed, they have many problems in oxidation film formation and others. At present, although various technologies are devised to realize devices that operate at sizes of 0.1 $\mu$m or less and the devices are actually developed, there are many problems as fabrication technologies.

Therefore, if a technology of fabricating electronic devices by carbon nanotubes is offered, it is expected that devices which are capable of high speed operation and are alternative to the processing process of silicon devices coming near the limit can be proposed. In "The Journal of Physical Chemistry B. Vol. 103, No. 36, 1999, pp. 7551–7556", a method of producing carbon nanotubes and the electrically linear characteristics (conductivity characteristics) of obtained carbon nanotubes are described.

However, carbon nanotubes produced by arc discharge, laser ablation, and the like are almost constant in thickness but different in length, from several tens of nm to several mm, and have difficulty in controlling the length thereof. A technology of obtaining carbon nanotubes of a size necessary to form devices is presently not available. With prior arts, carbon nanotubes of a size incidentally obtained are only used, and although carbon nanotubes can be experimentally used, it has been difficult to industrially use them as electronic device materials.

Connections of carbon nanotubes with metallic electrodes have counted against high-speed operation because of high contact resistance.

SUMMARY OF THE INVENTION

Accordingly, the present invention has been made in view of the above circumstances and provides a transistor of nanometer size that is capable of high-speed operation and operates at room temperatures by using carbon nanotubes for semiconductor devices.

It is known that ultrasonically processing single-wall carbon nanotubes causes minute rings, that is, carbon nanotube rings referred to in the present invention to be formed. The present invention is characterized in that a transistor as an electronic device is formed using the carbon nanotube rings.

The present invention provides a transistor using a carbon nanotube ring having semiconductor characteristics as a semiconductor material.

The present invention also provides a transistor using a carbon nanotube ring having conductivity or semiconductor characteristics as an electrode material.

The present invention also provides carbon nanotube rings having p-type semiconductor characteristics.

The present invention also provides a semiconductor device in which carbon nanotube rings having the p-type semiconductor characteristics are placed on an n-type semiconductor substrate thereof.

The present invention succeeds in forming a transistor of stable quality by using carbon nanotube rings in which carbon nanotubes are formed in ring shape. This is because carbon nanotube rings made of carbon nanotubes are obtained with a small range of variations of sizes (outside ring diameter) thereof, and the obtained carbon nanotube rings can be classified by size, so that carbon nanotube rings of stable size can be used as a semiconductor material or an electrode material.

DESCRIPTION OF THE DRAWINGS

Preferred embodiments of the present invention will be described in detail based on the followings, wherein.

DESCRIPTION OF THE PREFERRED EMBODIMENTS

A transistor of the present invention falls into two categories: one is characterized in that carbon nanotube rings having semiconductor characteristics are used as semiconductor materials; and the other is characterized in that carbon nanotube rings having conductivity or semiconductor characteristics are used as electrode materials.

The former functions as an active element in which, for example, a substrate such as an n-type semiconductor substrate as a control electrode (gate electrode) and a carbon nanotube ring having p-type semiconductor properties are electrically insulated from each other and placed so that the ring face thereof contacts the substrate, wherein two electrodes are connected to the carbon nanotube ring as source and drain electrodes, respectively, and a current flowing between the source and drain electrodes, or a voltage applied between the source and drain electrodes is controlled by changing the potential of the gate electrode. The control electrode (gate electrode) is not limited to n-type semiconductor substrates or other substrates and does not matter in the present invention if it is placed in the vicinity of the carbon nanotube ring with a space therebetween. Where an n-type semiconductor substrate is used, available concrete materials are single crystal silicon, gallium arsenic, indium phosphorus, gallium nitride, diamond, and the like.

In the latter, for example, an n-type semiconductor substrate and a carbon nanotube ring having conductivity or p-type semiconductor properties are placed in Schottky-connection so that the ring face thereof contacts the substrate; the carbon nanotube ring functions as a control electrode (gate electrode); one electrode (drain or source electrode) is in ohmic contact with a portion of the semiconductor substrate surface that comes from the opening of the carbon nanotube ring; and another electrode (drain or source electrode different from the abovementioned electrode) is in ohmic contact with a location of the semiconductor substrate surface that is in the vicinity of the carbon nanotube ring with a space therebetween. The carbon nanotube ring serving as a gate electrode is electrically independent of the one electrode placed within the opening of the carbon nanotube tube ring, and a current flowing between the electrode and the other electrode placed in the vicinity of the carbon nanotube ring with a space therebetween, or a voltage applied between both electrodes is controlled by changing the potential of the gate electrode, and therefore the transistor functions as an active element.

Generally, the basic structure of a carbon nanotube includes six-membered rings and has the structure that common graphite is closed into a hollow tube. Carbon nanotubes fall broadly into two categories: single-wall and multiple-wall. Single-wall carbon tubes are generally 1 to 10 nm in thickness (diameter). On the other hand, multiple-wall carbon nanotubes have various thicknesses (diameters), some as thick as hundreds of nm. As described previously, there are two types of single-wall carbon nanotubes: one exhibits semiconductor characteristics and the other exhibits conductivity. Those exhibiting semiconductor characteristics are presumed to be p-type ones. In a first embodiment example described later, it is proved that single-wall carbon nanotubes having semiconductor characteristics are p-type ones.

The above-described carbon nanotube rings can be made of single-wall carbon nanotubes as described below.

First, single-wall carbon nanotubes used as materials are produced by the arc discharge or chemical vapor deposition method. Thereafter, the obtained single-wall carbon nanotubes are ultrasonically processed in methanol. At this time, by including several percent of a proper surfactant in the methanol, dispersion properties are increased. Next, the carbon nanotubes rupture in the ultrasounds and deform in a ring shape, so that carbon nanotube rings are formed. The carbon nanotube rings are isolated by centrifugation. The obtained carbon nanotube rings exist singly by themselves or include about 2 to 10 bundles (the latter is called an aggregate of carbon nanotube rings). Individual single-wall carbon nanotubes are normally presumed to be p-type semiconductors if they exhibit semiconductor characteristics. Although it is understood that a factor in determining whether the single-wall carbon nanotubes have semiconductor characteristics or conductivity depends on a change of a chiral structure (torsion structure) of the carbon nanotubes or is ascribable to defects of carbon nanotubes, details are unknown as of this point in time.

A method of fabricating carbon nanotubes is described in detail by R. Martel, H. R. Hera and P. Avouris, "Journal of Physical Chemistry B" volume 103, number 36, Sep. 9, 1999, p. 7551–7556, from thirteenth line at the left to seventh line at the right, page 7552. In the present invention, the method is applicable without changes. Furthermore, in the present invention, to discern the sizes of carbon nanotube rings, unlike R. Martel, without using a sulfuric acid and hydrogen peroxide solution as a dispersion liquid, by using a surfactant methanol solution, it is desirable to optimize ultrasonic processing time and centrifugal separation conditions. Depending on processing conditions, carbon nanotube rings of a uniform size can be obtained in the range of 20 to 50 nm.

Hereinafter, the present invention will be described in detail using preferred embodiments.

<First Embodiment>

Figure 1:
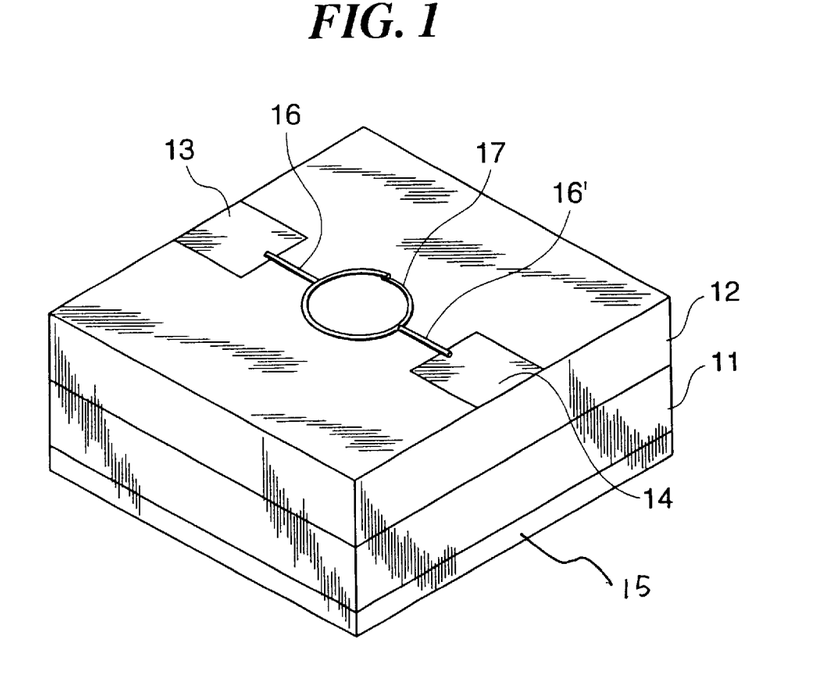
FIG. 1 is a schematic perspective view showing a first embodiment of a transistor of the present invention.

FIG. 1 is a schematic perspective view showing a first embodiment of a transistor of the present invention. In this embodiment, carbon nanotube rings having semiconductor characteristics are used as a semiconductor material. As shown in FIG. 1, in the transistor of this embodiment, a silicon oxide film (insulative thin film) 12 several tens of nm in thickness is formed on one surface of an n-type silicon substrate 11 and a gate electrode terminal 15 having a metallic electrode of Au or the like is formed on another surface thereof. On a surface of the silicon oxide film 12, a carbon nanotube ring 17 is mounted so that the ring face thereof contacts the surface (that is, as shown in FIG. 1, the ring lies; this is also the same for the following description). The carbon nanotube ring 17 is connected at each end thereof with multiple-wall carbon nanotubes 16 and 16', which function as source and drain electrodes, respectively. At this time, it is desirable to form the multiple-wall carbon nanotubes 16 and 16' by using a scanning probe microscope as a manipulator. The respective ends of the opposite sides of the sides at which the multiple-wall carbon nanotubes 16 and 16' are connected to the carbon nanotube ring 17 are connected with a source electrode terminal 13 and a drain electrode terminal 14.

In the transistor of this embodiment, a current or voltage flowing between the source electrode terminal 13 and the drain electrode terminal 14 can be controlled by changing the potential of the gate electrode terminal 15. In other words, the transistor serves as a transistor of nanometer size that is capable of high-speed operation and operates at room temperatures.

As materials of the two electrodes connected to the carbon nanotube ring 17, although normal metals may be used, by using conductive carbon nanotubes, particularly, multiple-wall carbon nanotubes 16 and 16' as used in this embodiment, electrode wiring of low contact resistance can be realized by tunnel junction with the carbon nanotube ring 17.

The contact resistance between the carbon nanotube ring 17 and multiple-wall carbon nanotubes 16 and 16' is desirably 0Ω or more and 1 MΩ or less, more desirably 1Ω or more and 100 kΩ or less for high-speed operation. The diameter of the multiple-wall carbon nanotubes 16 and 16' is desirably 1 nm or more and 1 μm or less, more desirably 5 nm or more and 100 nm or less.

The carbon nanotube ring 17 is desirably single-wall carbon nanotube rings or an aggregate of them, and the outside diameter of the ring is desirably 0 nm or more and 10 μm or less, more desirably 15 nm or more and 1 μm or less, and further more desirably 20 nm or more and 100 nm or less.

As the carbon nanotube ring 17, the thickness (the diameter of carbon nanotube itself) of the tube portion is desirably 1 nm or more and 1 μm or less, more desirably 5 nm or more and 100 nm or less.

Although an n-type silicon substrate 11 is used as a gate electrode (control electrode) in this embodiment, any material having conductivity or n-type semiconductor characteristics may be used. In other words, there is no problem if the gate electrode (control electrode) 15 is disposed in the vicinity of the carbon nanotube ring 17 with a space therebetween. In the case where a material having n-type semiconductor characteristics is used, a substrate made of gallium arsenic, indium phosphorus, gallium nitride, or diamond may be used in place of the n-type silicon substrate 11.

As an insulative thin film disposed between the carbon nanotube ring 17 and the gate electrode (control electrode), although the silicon oxide film 12 is used in this embodiment, the present invention is not limited to this and any material may be employed as long as an insulative film is used. As in this embodiment, where the n-type silicon substrate 11 is used as a base substrate, it is desirable to use a silicon oxide film in terms of the ease of transistor formation.

Although the thickness of the insulative thin film depends on the characteristics of a desired transistor, it is generally several tens of nm, preferably 5 to 20 nm.

<Second Embodiment>

Figure 2:
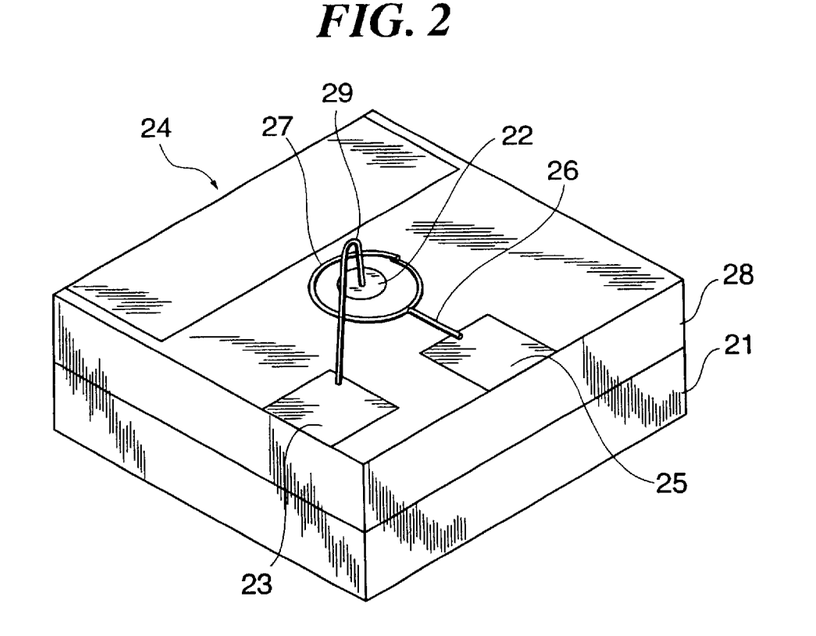
FIG. 2 is a schematic perspective view showing a second embodiment of the transistor of the present invention.

FIG. 2 is a schematic perspective view showing a second embodiment of the transistor of the present invention. In this embodiment, a carbon nanotube ring having conductivity or semiconductor characteristics is used as an electrode material.

As shown in FIG. 2, in the transistor of this embodiment, an n-type impurity layer 28 indicative of an n$^+$ region is formed on one surface of an n-type semiconductor substrate 21 serving as a base substrate, and a carbon nanotube ring 27 having p-type semiconductor characteristics is disposed on top of the layer 28 so that the ring face thereof contacts the layer 28, to form a gate electrode (control electrode). One end of the multiple-wall carbon nanotube 26 having conductivity is connected to the carbon nanotube ring 27, and the other end thereof is connected with a gate electrode terminal 25 made of a metallic material such as Au. One end of a multiple-wall carbon nanotube 29 is in ohmic contact with a portion of the surface of the n-type semiconductor substrate 21 that comes from the opening of the carbon nanotube ring 27 to form a source electrode (one electrode) 22, and the other end thereof is connected with a source electrode terminal 23 across the carbon nanotube ring 27 (the source electrode terminal 23 is insulated from the n-type semiconductor substrate 21). Furthermore, the drain electrode (another electrode) 24 is in ohmic contact with a location of the n-type semiconductor substrate 21 that is in the vicinity of the carbon nanotube ring 27 with a space therebetween.

As a substrate, it is desirable to use an n-type semiconductor substrate in this embodiment, because the carbon nanotube ring 27 having p-type semiconductor characteristics is used. Although the most suitable substrate is a silicon substrate, a substrate made of indium phosphorus, gallium nitride, diamond, or the like may also be used. In the case where a silicon substrate is used, the surface of the silicon substrate must be stabilized when handled in the air. Treating the silicon substrate with a hydrogen fluoride aqueous solution causes dangling bonds (bonds having no partner) on the silicon substrate surface to bond with H (hydrogen).

Since a naturally oxidized film thickness of the silicon substrate is about 1 nm, for example, when using a carbon nanotube ring 50 nm in outside diameter, it is effective to stabilize the surface of the base substrate. Stabilizing the silicon substrate surface with H reduces the influence of oxide and makes it possible to realize a stable Schottky connection between the carbon nanotube ring and the base substrate.

The drain electrode 24 made of a metallic material such as Au formed on the surface of the n-type semiconductor substrate 21 must be brought into ohmic contact with the n-type semiconductor substrate 21. To make the ohmic contact possible, it is desirable to form an n$^+$ region on the surface of the n-type semiconductor substrate 21. Ion implantation is ordinarily performed to form the n-type impurity layer 28 by forming the n$^+$ region. In this case, As is desirable as the kind of ion to be implanted to maintain a high level of impurity density in the vicinity of the surface of the n-type semiconductor substrate 21. It is desirable to implant the ion by an amount sufficient to obtain an n-type impurity density of $10^{13}$ cm$^{-3}$ or more as an average density in this embodiment that uses the carbon nanotube ring 27 as a gate electrode.

To improve impurity density, it is desirable to polish the n-type semiconductor substrate 21 surface on which the n-type impurity layer 28 is formed, by known methods such as mechanochemical polishing (abrasive GLANZOX) and the like. It is desirable to polish the surface by about 100 nm to 2 $\mu$m, more desirably about 200 to 500 nm.

The junction resistance between the drain electrode 24 and the n-type semiconductor substrate 21 is desirably 1 m$\Omega$ or more and 100 k$\Omega$ or less, more desirably 1$\Omega$ or more and 50 k$\Omega$ or less, still more desirably 100$\Omega$ or more and 10 k$\Omega$ or less.

The electrically independent carbon nanotube ring 27 is secured (mounted) in the vicinity of the drain electrode 24 with a space therebetween, to form a gate electrode. Although the carbon nanotube ring 27 desirably has p-type semiconductor characteristics as in this embodiment, they may have conductivity.

It is required that the carbon nanotube ring 27 and the drain electrode 24 be near to each other and away from each other. A concrete spacing between the two is desirably about 1 nm to 50 $\mu$m, more desirably about 5 to 200 nm.

As described previously, one end of the multiple-wall carbon nanotube 26 is connected to the carbon nanotube ring 27 serving as a gate electrode, and the other end thereof is connected with the gate electrode terminal 25. Although, in this embodiment, a multiple-wall carbon nanotube having conductivity is used for the wiring between the carbon nanotube ring 27 and the gate electrode terminal 25, metallic wiring of gold or the like may also be used. However, as in this embodiment, by using the multiple-wall carbon nanotube, electrode wiring of low contact resistance can be realized by tunnel junction with the carbon nanotube ring 27.

As already described, one end of the multiple-wall carbon nanotube 29 is in ohmic contact with a portion of the surface of the n-type semiconductor substrate 21 that comes from the opening of the carbon nanotube ring 27 to form a source electrode 22, and the other end thereof is connected with the source electrode terminal 23. Although, in this embodiment, the multiple-wall carbon nanotube having conductivity is used for the wiring (connecting wiring) between the source electrode 22 and the source electrode terminal 23, metallic wiring of gold or the like may also be used.

The junction resistance between the source electrode 22 and the n-type semiconductor substrate 21 is desirably 1 m$\Omega$ or more and 100 k$\Omega$ or less, more desirably 1$\Omega$ or more and 50 k$\Omega$ or less, still more desirably 100 $\Omega$ or more and 10 k$\Omega$ or less.

In the transistor of this embodiment, a current or voltage flowing between the source electrode terminal 23 and the drain electrode terminal 24 can be controlled by changing a potential applied to the carbon nanotube ring 27 serving as a gate electrode. In other words, the transistor serves as a transistor of nanometer size that is capable of high-speed operation and operates at room temperatures.

Preferred modes of the carbon nanotube ring 27 and the multiple-wall carbon nanotubes 26 and 29 used in this embodiment (size, contact resistance, etc. when both are connected) are the same as those of the carbon nanotube ring 17 and the multiple-wall carbon nanotubes 16 and 16' described in the first embodiment. Detailed descriptions of them are omitted.

In the mode of the transistor of this embodiment, it is more desirable to use an SOI (semiconductor on insulator) including silicon and silicon oxide as a base substrate. In this case, it is desirable to process the thickness of the superficial semiconductor layer to about 50 nm in combination of chemical mechanopolishing and etching. Furthermore, a polycrystalline silicon layer may be formed on the silicon oxide substrate surface by the chemical vapor deposition method so that the substrate to which an n-type impurity is introduced can be used. At this time, by annealing or the like, the crystal particle diameter of the polycrystalline silicon layer is regrown to 1 $\mu$m or more, which is larger than the ring outside diameter of the carbon nanotube ring, whereby a decline in mobility can be prevented.

<Third Embodiment>

Figure 3:
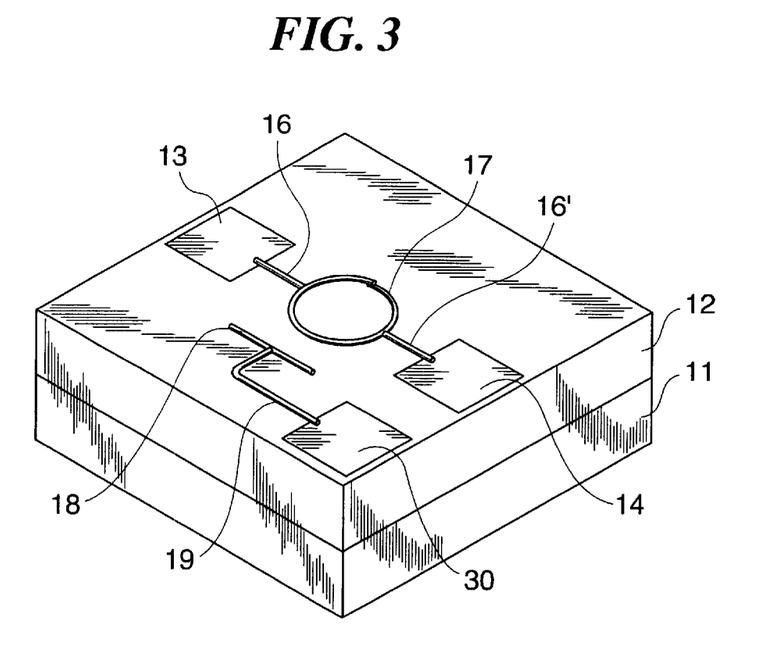
FIG. 3 is a schematic perspective view showing a third embodiment of the transistor of the present invention.

FIG. 3 is a schematic perspective view showing a third embodiment of the transistor of the present invention. In this embodiment, a carbon nanotube ring is used as a semiconductor material having semiconductor characteristics.

As shown in FIG. 3, in the transistor of this embodiment, a gate electrode (control electrode) 18 is disposed in the vicinity of a carbon nanotube ring 17 on the surface of a silicon oxide film (insulative thin film) 12 with a space therebetween. As other components, the n-type silicon substrate 11, silicon oxide film 12, source electrode terminal 13, drain electrode terminal 14, multiple-wall carbon nanotubes 16 and 16', and carbon nanotube ring 17 are configured and placed like the first embodiment.

Namely, the transistor of this embodiment is the same as the first embodiment including the preferred mode, except that the gate electrode is disposed not at the back of the n-type silicon substrate 11 but in the vicinity of the carbon nanotube ring 17 on the surface of the silicon oxide film (insulative thin film) 12 with a space therebetween. Members in FIG. 3 that have the same functions as those in the first embodiment are identified by the same reference numerals, and detailed descriptions of them are omitted.

It is desired that the carbon nanotube ring 17 and the gate electrode 18 are near to each other and away from each other. A concrete spacing between the two is desirably about 1 nm to 50 $\mu$m, more desirably about 5 to 200 nm, still more desirably about 10 nm.

The gate electrode 18 may be metallic wiring or a carbon nanotube (e.g., multiple-wall carbon nanotube). One end of a connecting wiring 19 is connected to the gate electrode 18 and the other end thereof is connected to a gate electrode terminal 30 made of a metallic material such as gold or the like. Although the connecting wiring 19 may also be metallic wiring or a carbon nanotube, it is desirable to use the same material as that of the gate electrode 18.

In the transistor of this embodiment, a current or voltage flowing between the source electrode terminal 13 and the drain electrode terminal 14 can be controlled by changing the potential of the gate electrode terminal 18. In other words, the transistor serves as a transistor of nanometer size that is capable of high-speed operation and operates at room temperatures.

Although, in this embodiment, as in the first embodiment, an n-type silicon substrate on which an insulative silicon oxide film 12 is formed is used as a substrate, any material may be used as long as the surface on which the carbon nanotube ring 17 is disposed has insulation properties (this is also true for a fourth embodiment described later). In other words, a substrate itself may have insulation properties, or as in this embodiment, a substrate, whether it has insulation properties or conductivity, may be provided with an insulative thin film. In this embodiment, all the substrates are included in the concept of "insulative substrates."

<Fourth Embodiment>

Figure 4:
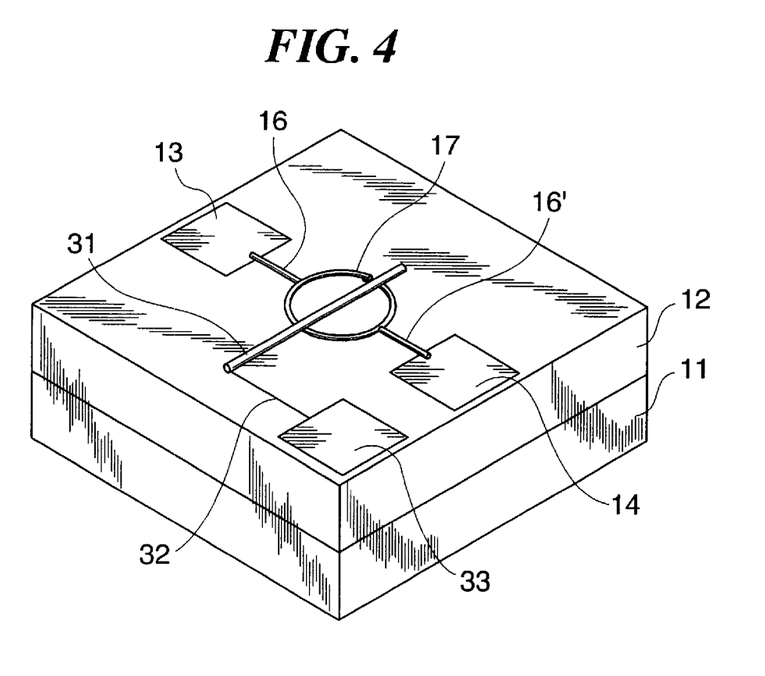
FIG. 4 is a schematic perspective view showing a fourth embodiment of the transistor of the present invention.

FIG. 4 is a schematic perspective view showing a first embodiment of the transistor of the present invention. In this embodiment, carbon nanotube rings having semiconductor characteristics are used as a semiconductor material.

As shown in FIG. 4, in the transistor of this embodiment, a gate electrode (control electrode) 31 is provided above the carbon nanotube ring 17 mounted on the surface of the silicon oxide film (insulative thin film) 12. The term "above" used herein refers to not an upper-lower relationship with the ground surface as reference but an portion above the carbon nanotube ring 17 with the silicon oxide film (insulative thin film) 12 as reference; there is no problem even if the upper-lower relationship with the ground surface as reference is reversed.

As other components, the n-type silicon substrate 11, silicon oxide film 12, source electrode terminal 13, drain electrode terminal 14, multiple-wall carbon nanotubes 16 and 16', and carbon nanotube ring 17 are configured and placed like the first embodiment.

As the gate electrode 31 provided above the carbon nanotube ring 17, although an extremely thin wire of precious metal (Au, Pt, etc.) several nm wide is applicable, a carbon nanotube tube having conductivity is preferably used. As a carbon nanotube tube having conductivity, both a single-wall carbon nanotube and a multiple-wall carbon nanotube are applicable.

One end of a connecting wiring 32 is connected to the gate electrode 31 and the other end thereof is connected to a gate electrode terminal 33 made of a metallic material such as gold or the like. Although the connecting wiring 32 may be any of a metallic wiring or a carbon nanotube tube having conductivity, it is desirable to use a material identical with that of the gate electrode 31.

In the transistor of this embodiment, a current or voltage flowing between the source electrode terminal 13 and the drain electrode terminal 14 can be controlled by changing the potential of the gate electrode terminal 31. In other words, the transistor serves as a transistor of nanometer size that is capable of high-speed operation and operates at room temperatures.

Where a carbon nanotube having conductivity is used as the gate electrode 31, the connection between the gate electrode 31 and the carbon nanotube ring 17 having semiconductor characteristics serves as Schottky connection, in which case a Schottky connection field-effect transistor can be formed.

Although the transistor of the present invention has been described in detail in conjunction with the four embodiments, the present invention is not limited to these embodiments, and any configuration to which the principle of the present invention is applicable can be adopted.

[Embodiment Examples]

Hereinafter, embodiment examples of the present invention will be described. However, the present invention is not limited to these examples.

(First Embodiment Example)

A carbon tube ring was produced by ultrasonically processing a single-wall carbon nanotube produced by the arc discharge method. Specifically, 50 mg of single-wall carbon nanotube was dispersed in 100 ml of methanol solution (surfactant density 5%) of surfactant (Wako Pure Chemical Industries, Ltd., benzalkonium chloride), and ultrasonic processing (frequency 20 kHz, output 50 w) was performed for about one hour. Thereafter, centrifugal separation was performed for about 30 minutes by centrifugation. After the carbon nanotube ring dispersed in the liquid was recovered by a filter, it was cleaned by methanol and acetone on the filter. The ring outside diameter of the obtained carbon nanotube ring was about 20 to 50 nm, and the thickness of the tube part was 2 to 30 nm. In this embodiment example, carbon nanotube rings having p-type semiconductor characteristics that have a ring outside diameter of about 50 nm and a tube part 5 nm in thickness were used.

Using the obtained carbon nanotube rings, the transistor as shown in FIG. 1 was fabricated as described below.

As a base substrate, the n-type silicon substrate of (111) face was used. The surface thereof was cleaned by a detergent, and then was rinsed with pure water, processed by isopropyl alcohol steam, and dried. Thereafter, Au was evaporated on one side (back side) of the n-type silicon substrate 11, and a gate electrode terminal 15 was placed. Furthermore, a silicon oxide film 12 of 50 nm was grown by the plasma CVD method, and on top of it, a polycrystalline silicon layer was formed by the reduced pressure CVD method. Next, As was doped (ion injection acceleration energy 40 keV, ion injection quantity of $2 \times 10^{15}$ cm$^{-2}$) on the surface of the n-type silicon substrate 11 by ion implantation, and the crystal was recovered by rapid annealing (peak temperature of about 1200° C.). Next, to remove an oxidation film from the surface and stabilize the surface, the surface was processed by HF, and dangling bonds on the surface of the n-type silicon substrate 11 were subjected to end processing by H. Generally, if the Si (111) face is subjected to the H end processing, since stable Si—H$_2$ is formed, the silicon substrate surface becomes resistant to oxidation even in the air.

In this state, the above-described carbon nanotube ring dispersed in the methanol was expanded on the silicon oxide film 12 on the surface of the n-type silicon substrate 11 by spin coating, and the carbon nanotube ring 17 was mounted. Next, the multiple-wall carbon nanotubes 16 and 16' (about 15 nm in diameter) were connected to both ends of the carbon nanotube ring 17, and wiring was performed so that the other ends of the multiple-wall carbon nanotubes 16 and 16' were connected to the source electrode terminal 13 and the drain electrode terminal 14. The multiple-wall carbon nanotubes 16 and 16' were wired using a scanning probe microscope (SPM) having two piezoelectric actuators, and the multiple-wall carbon nanotubes were used as the probes.

Figure 5:
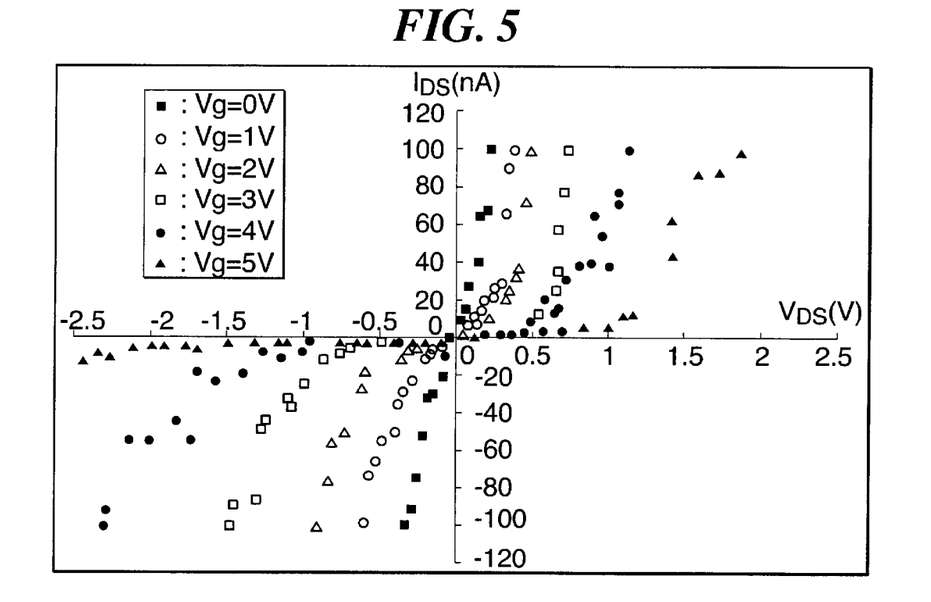
FIG. 5 is a diagram showing current and voltage properties between a source electrode and a drain electrode of the transistor of another embodiment.

For the transistor of the first embodiment example obtained in this way, it was confirmed that changes appeared in current and voltage properties between the source electrode and drain electrode of the carbon nanotube ring 17 by changing the potential of the gate electrode having the n-type silicon substrate 11. Specifically, when the potential (Vg) of the gate electrode terminal 15 was changed in increments of 1 V between 0 and 5 V, current and voltage properties between the source electrode terminal 13 and the drain electrode terminal 14 were measured using an electrometer 6514 manufactured by Keithley, Instruments, Inc. The measurement was performed at room temperature (23° C.). The result is shown in FIG. 5.

(Second Embodiment Example)

Using the carbon nanotube rings obtained in the first embodiment example, a transistor shown in FIG. 2 was fabricated.

The same n-type semiconductor substrate 21 of (111) face as in the first embodiment example was provided, and As was implanted to the surface thereof by ion implantation to form the n-type impurity layer 28 of n$^+$ region. To maximize the density of As on the surface, the surface was polished by about 300 nm by mechanochemical polishing (abrasive GLANZOX).

Next, Au was evaporated on the surface by sputtering and the drain electrode in ohmic contact was formed. Furthermore, as in the first embodiment example, the surface of the n-type semiconductor substrate 21 was subjected to H end processing to stabilize it.

In this state, the above-described carbon nanotube ring dispersed in methanol was expanded on the n-type impurity layer 28 on the surface of the n-type silicon substrate 11 by spin coating, and the carbon nanotube ring 27 was mounted. As the carbon nanotube ring 27, the one having conductivity that has a ring outside diameter of about 50 nm and a tube part 8 nm in thickness was used.

In the same way as in the first embodiment example, wiring was performed using a scanning probe microscope (SPM) having two piezoelectric actuators, and multiple-wall carbon nanotubes (about 15 nm in diameter) as probes. First, the multiple-wall carbon nanotube 26 was connected to the carbon nanotube ring 27 and the gate electrode terminal 25 by a first probe of SPM. Next, by a second probe, the multiple-wall carbon nanotube 29 was connected to the surface of the n-type semiconductor substrate 21 that comes from the opening of the carbon nanotube ring 27 and the source electrode terminal 23. In this way, the transistor of the second embodiment example was fabricated.

Figure 6:
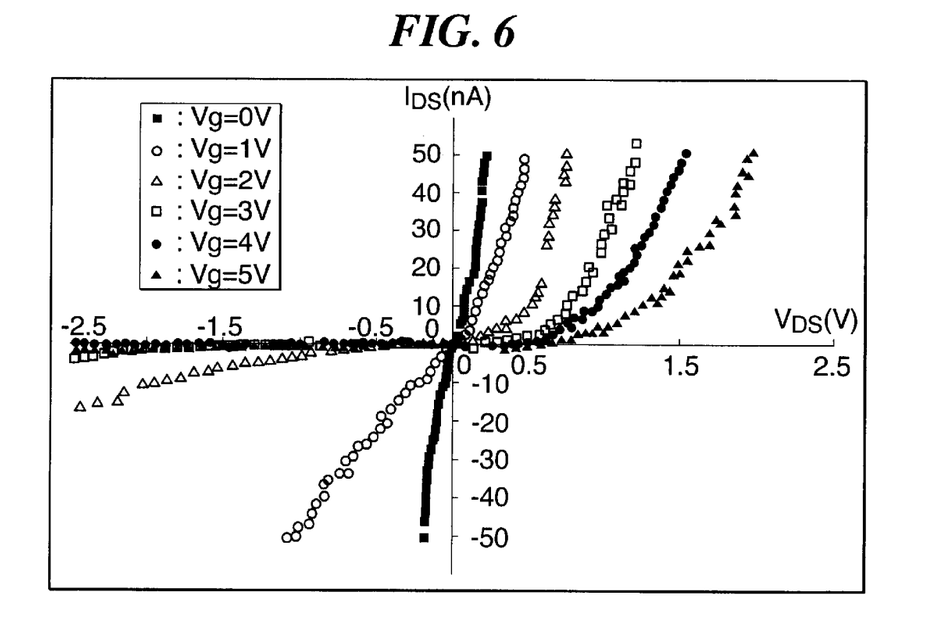
FIG. 6 is a diagram showing current and voltage properties between a source electrode and a drain electrode of the transistor of another embodiment.

For the transistor of the second embodiment example obtained in this way, it was confirmed that changes appeared in current and voltage properties between the source electrode 22 and drain electrode 24 by changing the potential of the gate electrode having the carbon nanotube ring 27. Specifically, when the potential (Vg) of the gate electrode terminal 25 was changed in increments of 1 V between 0 and 5 V, current and voltage properties between the source electrode terminal 23 and the drain electrode 24 were measured using an electrometer 6514 manufactured by Keithley, Instruments, Inc. The measurement was performed at room temperature (23° C.). The result is shown in FIG. 6.

According to the transistor of the present invention, a switching device using carbon nanotubes that is as small as nanometer size and capable of high-speed operation, and operates at room temperature can be realized and has extremely high industrial advantages.

The entire disclosure of Japanese Patent Application No. 2000-263943 filed on Aug. 31, 2000 including specification, claims, drawings and abstract is incorporated herein by reference in its entirety.

What is claimed is:

1. A transistor that uses a carbon nanotube ring as a semiconductor material, the carbon nanotube ring having semiconductor characteristics.

2. The transistor according to claim 1, wherein two electrodes are connected to the carbon nanotube ring, and a control electrode is disposed in a vicinity of the carbon nanotube ring with a space therebetween.

3. The transistor according to claim 2, wherein:

the carbon nanotube ring is mounted on an insulative thin film surface so that the ring face thereof contacts the insulative thin film surface; and the control electrode is disposed on the back face of the insulative thin film surface on which the carbon nanotube ring is mounted.

4. The transistor according to claim 2, wherein:

the carbon nanotube ring is mounted on an insulative substrate surface so that the ring face thereof contacts the insulative substrate surface; and the control electrode is disposed in a position of the insulative substrate surface that is in the vicinity of the carbon nanotube ring with a space therebetween.

5. The transistor according to claim 2, wherein:

the carbon nanotube ring is mounted on an insulative substrate surface so that the ring face thereof contacts the insulative substrate surface; and a control electrode is disposed above the carbon nanotube ring mounted on the insulative substrate surface.

6. The transistor according to claim 2, wherein wall carbon nanotubes having conductivity are used as materials of the two electrodes connected to the carbon nanotube ring.

7. The transistor according to claim 6, wherein a diameter of the carbon nanotubes having conductivity is 1 nm or more and 1 μm or less.

8. The transistor according to claim 1, wherein the carbon nanotube ring having semiconductor characteristics or conductivity is single-wall carbon nanotube rings or an aggregate of them.

9. The transistor according to claim 1, wherein an outside diameter of the carbon nanotube ring having semiconductor characteristics or conductivity is 10 nm or more and 10 μm or less.

10. The transistor according to claim 1, wherein a thickness of a tube part of the carbon nanotube ring having semiconductor characteristics or conductivity is 1 nm or more and 1 μm or less.

11. The carbon nanotube ring according to claim 1, wherein the carbon nanotube ring comprises multiple-wall carbon nanotubes.

12. A transistor that uses a carbon nanotube ring as an electrode material, the carbon nanotube ring having conductivity or semiconductor characteristics.

13. The transistor according to claim 12, wherein:

the carbon nanotube ring is mounted on a semiconductor substrate surface so that the ring face thereof contacts the semiconductor substrate surface, to form a control electrode;

one electrode is disposed on a position of the semiconductor substrate surface to appear from an opening of the carbon nanotube ring; and another electrode is disposed in a position of the semiconductor substrate surface as to be in a vicinity of the carbon nanotube ring with a space therebetween.

14. The transistor according to claim 13 in which a carbon nanotube ring serving as a control electrode is provided with a terminal through a connecting wiring, wherein a conductive carbon nanotube is used as the connecting wiring.

15. The transistor according to claim 14, wherein a diameter of the carbon nanotube tube having conductivity is 1 nm or more and 1 μm or less.

16. The transistor according to claim 13, wherein a junction resistance between the electrode and/or the other electrode disposed on the semiconductor substrate surface, and the semiconductor substrate surface is 1 mΩ or more and 100 kΩ or less.

17. The transistor according to claim 13, wherein the semiconductor substrate is a silicon substrate, and dangling bonds on a surface of the silicon substrate are subjected to hydrogen end processing.

18. A carbon nanotube ring having p-type semiconductor characteristics.

19. A semiconductor device in which a carbon nanotube ring having p-type semiconductor characteristics is placed on an n-type semiconductor substrate thereof.

* * * * *